United States Patent
Li et al.

(10) Patent No.: US 6,769,099 B2
(45) Date of Patent: Jul. 27, 2004

(54) METHOD TO SIMPLIFY AND SPEED UP DESIGN RULE/ELECTRICAL RULE CHECKS

(75) Inventors: Mu-Jing Li, Sunnyvale, CA (US); Amy Yang, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 117 days.

(21) Appl. No.: 10/121,322

(22) Filed: Apr. 12, 2002

(65) Prior Publication Data

US 2003/0196180 A1 Oct. 16, 2003

(51) Int. Cl.[7] ............................................. G06F 17/50
(52) U.S. Cl. ................................................ 716/2; 716/4
(58) Field of Search ............................ 716/1, 4, 5, 11, 716/18, 2

(56) References Cited

U.S. PATENT DOCUMENTS

| | | | |
|---|---|---|---|
| 4,613,940 A | 9/1986 | Shenton et al. | |
| 4,630,219 A | 12/1986 | DiGiacomo et al. | |
| 5,062,054 A | 10/1991 | Kawakami et al. | |
| 5,249,134 A | 9/1993 | Oka | |
| 5,416,722 A | 5/1995 | Edwards | |
| 5,689,433 A | 11/1997 | Edwards | |
| 5,706,295 A | 1/1998 | Suzuki | |
| 5,757,563 A | * 5/1998 | Huang | 359/856 |
| 6,063,132 A | * 5/2000 | DeCamp et al. | 716/5 |
| 6,078,737 A | 6/2000 | Suzuki | |
| 6,182,020 B1 | 1/2001 | Fairbanks | |
| 6,378,110 B1 | 4/2002 | Ho | |
| 2003/0061583 A1 | * 3/2003 | Malhotra | 716/5 |

OTHER PUBLICATIONS

U.S. patent application Ser. No. 10/103,521, Li et al. filed Mar. 21, 2002.

* cited by examiner

Primary Examiner—Leigh M. Garbowski
(74) Attorney, Agent, or Firm—Zagorin, O'Brien & Graham LLP (57) ABSTRACT

A method, apparatus and computer program product for checking of integrated circuit design files using rules files. Each of the rules files has a rule associated therewith. The rules are sequentially compared with objects associated with the design files in an object-to-check-pool (OTCP). The sequence in which the rules are compared to objects in the OTCP is arrange to maximize a probability of determining whether design characteristics of the objects in the OTCP satisfies all rules associated with the rules files while minimizing a number of rules that must be compared with the OTCP.

20 Claims, 4 Drawing Sheets

METHOD TO SIMPLIFY AND SPEED UP DESIGN RULE/ELECTRICAL RULE CHECKS

TECHNICAL FIELD OF THE INVENTION

One or more embodiments of the present invention pertain to method and apparatus for checking integrated circuit (IC) designs.

BACKGROUND OF THE INVENTION

As the size of integrated circuit (IC) features continues to shrink, and the demand for increased circuit density has correspondingly increased, IC designers have been turning to automated design tools, layout tools, and checking tools. Fabrication of ICs is dependent upon the creation of a set of "masks" used during fabrication, where each mask in the set represents a different step in the fabrication (typically an addition or deletion of material). A digitized representation of an image of a mask is commonly called a "mask layer" or simply a "layer". Each layer is comprised of a set of geometric shapes representing the desired configuration of materials such as metal, polysilicon, or substrate in a finished IC. For example, layers can represent the deposition of metal, or the etching away of resistive material between two layers of metal so that a "via" is opened.

As is well known, semiconductor physical design follows design rules that are defined, for example, by an integrated circuit manufacturing factory (for example, a foundry) to fabricate the design using a particular manufacturing technology. Thus, design rules are restrictions, or guidelines, within which the design can be implemented so the foundry can use its manufacturing technology to fabricate ICs according to the design. In general, before a layout design of a particular level is transferred onto a photolithography reticle, the design is in the form of a digital computer file, where each of the features has a plurality of associated X and Y coordinates that define their location on a mask. A key task in designing a quality IC is to ensure that the designed features obey the design rules and electrical rules (for example, rules specifying connectivity). For example, and without limitation, design rule checks may identify: (a) layers having a floating metal; (b) devices having a partial gate; (c) metal features with a width larger than a predetermined amount; (d) violations of width, spacing, enclosure, and hole design rules; (e) violations of slot rules; (f) violations of dead zone rules; and (g) special gate rules. Accordingly, because ICs typically comprise a large number of features, designers typically employ commercially available software products to perform operations known as "design rule checks" (DRCs) and/or "electrical rule checks" (ERCs). In general, one or more DRCs/ERCs are applied to the features of each layer: (a) directly by measuring their shapes and their relationships to each other, and/or (b) indirectly by creating intermediate layers (also known as "derived layers"). Exemplary DRC/ERC processing may include determinations of whether certain minimum inter-feature spacings have been violated, whether successive levels are overlapping, and so forth. Derived layers often are more amenable to design rule checking than the original layers, and can be used in the creation of subsequently derived layers.

As is known, a physical computer aided design ("CAD") environment is set up—based on design rules and electrical rules—to implement an IC design, and to check whether the design meets the design and electrical rules. For high performance CPU chip designs, a large number of complex DRCs/ERCs are performed, each of the complex DRCs/ERCs requires a large amount of computer time to complete (for example, some of the DRCs/ERCs are so complex that merely completing one such check may require many steps of sizing and stretching features to separate those features that violate the DRCs/ERCs from those that do not). In addition, the complex DRCs/ERCs typically are performed on each feature in a category of features—even though only a small percentage of features in the category of features might violate the complex DRCs/ERCs. Since a typical design database for a complex IC contains many features, every extra step in a rules check weighs heavily on the overall performance of the verification software. In fact, at times, the verification software can run out of memory or disk space.

In light of the above, there is a need to simplify DRCs/ERCs for complex IC designs.

SUMMARY OF THE INVENTION

One or more embodiments of the present invention advantageously satisfy the above-identified need in the art. Specifically, one embodiment of the present invention is a method for checking integrated circuit design files using rules files. Each of the rules files has a rule associated therewith. The rules are sequentially compared with objects associated with the design files in an object-to-check-pool (OTCP). The sequence in which the rules are compared to objects in the OTCP is arranged to maximize a probability of determining whether design characteristics of the objects in the OTCP satisfies all rules associated with the rules files while minimizing a number of rules that must be compared with the OTCP.

DETAILED DESCRIPTION

One or more embodiments of the present invention pertain to method and apparatus for checking integrated circuit (IC) designs that are in the form of digital computer files, the files delineate features and their location in a mask layer (also referred to as a layer). The checking operations determine whether such IC designs obey design rules relating to a manufacturing technology (for example, to determine whether predetermined spacing relations between features are maintained) and whether such IC designs obey electrical rules (for example, to detect possible misalignments between integrated circuit layout levels). Preferably, one or more of such embodiments are embodied in a computer implemented design rule checker (DRC)/electrical rule checker (ERC). In the following description, numerous specific details are set forth in order to provide a thorough understanding of the present invention. It will be understood, however, by one of ordinary skill in the art, that some embodiments of the present invention may be practiced without some or all of these specific details. In other instances, well known process operations have not been described in detail in order not to obscure an understanding of the present invention.

A central component of the present invention is the implementation of DRC/ERC verification software for checking IC design features that are characterized as coordinates in digital computer files. Therefore, one or more embodiments of the present invention are well suited to adapt the capabilities of DRC/ERC verification software to perform well known operations, such as, for example, and without limitation, sizing operations, minimum area comparisons, and so forth.

Figure 1:
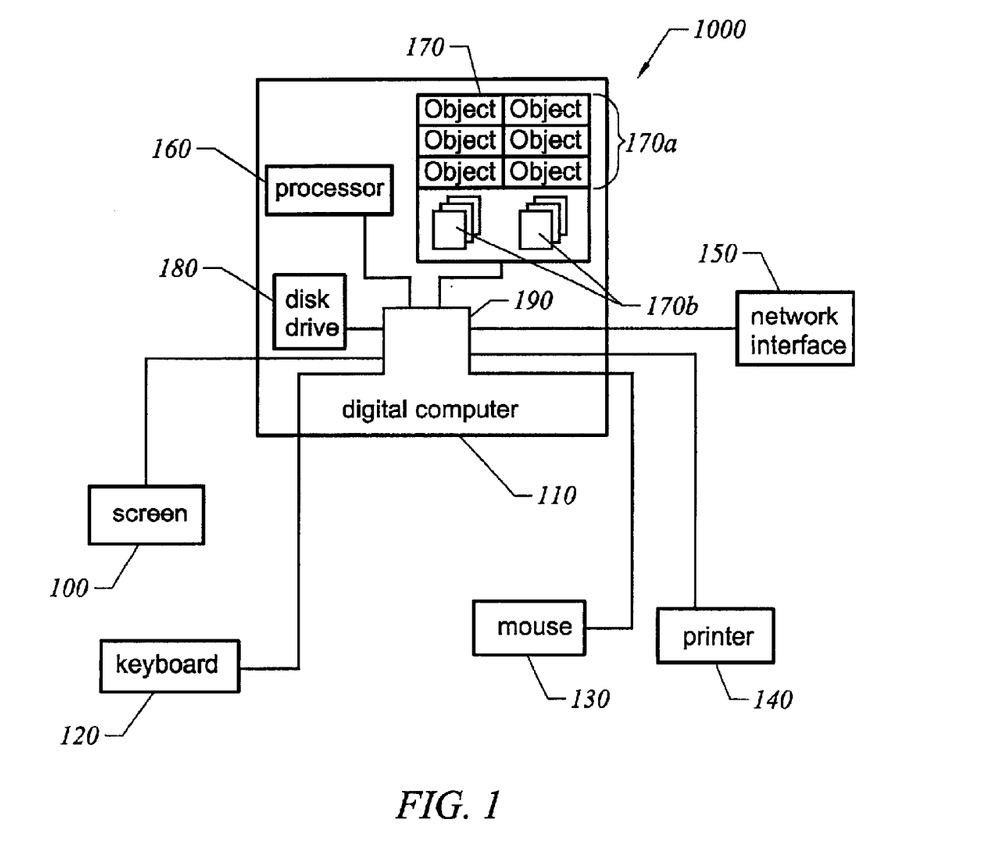
FIG. 1 is a block diagram of system 1000 that is fabricated in accordance with one embodiment of the present invention.

FIG. 1 is a block diagram of design verification computer system 1000 that is used to carry out processing in accordance with one or more embodiments of the present invention. As shown in FIG. 1, system 1000 includes display screen (or monitor) 100, digital computer 110, keyboard 120, mouse 130, printer 140, and network interface 150. Digital computer 110 includes familiar computer components such as, for example, and without limitation, processor 160, memory storage devices such as a random access memory (RAM) 170 and disk drive 180, and system bus 190 that interconnects the above-identified components. Note that: (a) mouse 130 is but one example of a graphical input device—a trackball is another example; (b) a modem is but one example of network interface 150 that enables system 1000 to be coupled to a network—a network interface card is another example; and (c) RAM 170 and disk drive 180 are examples of a computer-readable memory (i.e., a tangible medium) for storage of computer code and computer programs—other types of computer-readable media include floppy disks, removable hard disks, optical storage media such as CD-ROMS, and semiconductor memories such as flash memory and read-only-memories (ROMs). RAM 170 is used by processor 160 as a general storage area and as scratch-pad memory. It can also be used to store input data and processed data. ROM can be used to store instructions or program code followed by processor 160 as well as other data. Network interface 150 is used to send and receive data over a network connected to other computer systems—an interface card or similar device and appropriate software implemented by processor 160 can be used to connect computer system 1000 to an existing network and transfer data according to standard protocols.

Digital computer 110 can be a personal computer (such as an IBM compatible personal computer, a Macintosh computer, or Macintosh compatible computer), a workstation computer (such as a Sun Microsystems workstation or a Hewlett-Packard workstation), or some other type of computer. In one such embodiment, computer system 1000 includes an UltraSparc computer running the Solaris operating system from Sun Microsystems of Sunnyvale, Calif. and Vampire software from Cadence Design Systems, Inc.

FIG. 1 is representative of but one type of computer system that may be used to implement one or more embodiments of the present invention. It will be readily apparent to one of ordinary skill in the art that many system types and hardware and software configurations including more or fewer components are suitable for use in conjunction with the present invention, such as an HP-755/125 computer from Hewlett-Packard Corporation. Processor 160 is a general purpose digital processor, which controls the operation of computer system 1000. Processor 160 can be a single-chip processor, or it can be implemented with multiple components. Using instructions retrieved from memory, processor 160 controls the reception and manipulation of input data, and the output and display of data on output devices.

According to one or more embodiments of the present invention, a particular function of processor 160 is to assist in the DRC/ERC operations.

One or more embodiments of the present invention may be fabricated as computer-readable code on a computer-readable medium. The computer-readable medium is any data storage device that can store data, which data can thereafter be read by a computer system. Examples of a computer-readable medium include, without limitation, read-only memory, random-access memory, CD-ROMs, magnetic tape, and optical data storage devices. Further, the computer-readable medium can also be distributed over a network of coupled computer systems so that the computer-readable code is stored and executed in a distributed fashion.

In accordance with one embodiment of the present invention, a physical lay-out of a circuit design may reside in RAM 170 as a plurality of objects 170*a*. Each of objects 170*a* has one or more design characteristics associated therewith that define electrical and mechanical characteristics of an object associated therewith. One or more embodiments of the present invention may utilize various computer-implemented operations involving data stored in a computer system. These operations are often referred to in terms, such as producing, identifying, determining, or comparing. For example, a plurality of rules files 170*b* may also be stored in PAM 170. One or more rules are associated with each of rules files 170*b* that are dictated by the electrical rules and/or the design rules. Processor 160 operates on the information contained in RAM 170 to compare the design characteristics of each of objects 170*a*, referred to as an object-to-checkpool (OTCP) with the rules associated with each of the design rules files 170*b*. In this manner, the circuit design may be analyzed to determine whether the same satisfies established design rules and electrical rules [hereinafter referred to collectively as rules].

In accordance with one embodiment of the present invention, verification of an IC design takes place sequentially by comparing the design characteristics of objects 170*a* in the OTCP with rules associated with rules files 170*b*. Specifically, one or more rules are associated with each of the rules files 170*b* that must be satisfied by objects 170*a* in the OTCP. The sequence in which the rules are compared with objects 170*a* in the OTCP is selected to maximize a probability of determining whether design characteristics of objects 170*a* in the OTCP satisfies all rules associated with the rules files 170*b*, while minimizing a number of rules that must be compared with objects 170*a* in the OTCP. This reduces the computational requirements that digital computer 110 must undertake and save run time while performing complex DRCs/ERCs.

To that end, each of the rules has a failure probability associated therewith. The failure probability indicates a level of possibility that the object compared within the OTCP would fail to satisfy the rule. The rules are sequentially compared with design characteristics of objects 170*a* in the OTCP, so that the objects in the OTCP are compared with rules having a lowest failure probability before being compared with the remaining rules of the sequence. One manner in which to arrange the sequence is from least complex to most complex. In this manner, the least complex rules are compared with objects 170*a* in the OTCP before comparison with more complex rules. With respect to the present invention, the term complex is defined to mean the computational power required for system 1000 to perform DRCs/ERCs with respect to design characteristics of objects 170*a*. The more complex, the greater the computational power that system 1000 must employ to perform the DRCs/

ERCs. The comparison in the present example commences with determining whether determines whether the design characteristics of objects 170a satisfy the requirements of the least complex rules associated with rules files 170b. Subsequent comparisons of objects 170a remaining in the OTCP are made with increasingly more complex rules.

The computational power required to perform DRCs/ERCs is reduced employing the aforementioned sequence of rules by reducing the number of objects 170a in the OTCP before comparison with more complex rules. To that end, at each instance that an object fails to satisfy the rules with which its design characteristics are compared, the object is removed (phased-out) from the OTCP. In this manner, the aforementioned object is not compared with more complex rules. As a result, the number of objects 170a in the OTCP is reduced as the complexity of the rules being compared therewith increase. This provides a filter wherein objects remaining in the OTCP have passed the checks at the previous stages, and are suitable for further checking.

Alternatively, the sequence in which the rules are compared may be derived from a priori knowledge. For example, the sequence may be defined based upon historical trends observed during DRCs/ERCs of previous OTCPs. Specifically, the arrangement of each rule in the sequence is selected so that the preceding rule in the sequence requires less computational power to provide a higher probability that the design characteristics fail to satisfy the preceding rule. As a result, the first rule in the sequence minimizes the computational power required to maximize the probability that the design characteristics of the object being compared therewith fails to satisfy the rules. It should be understood that the sequence in which rules are compared to design characteristics of objects 170a may be updated dynamically so that each successive OTCP undergoing DRCs/ERCs may have a differing sequence of rules.

Figure 2:
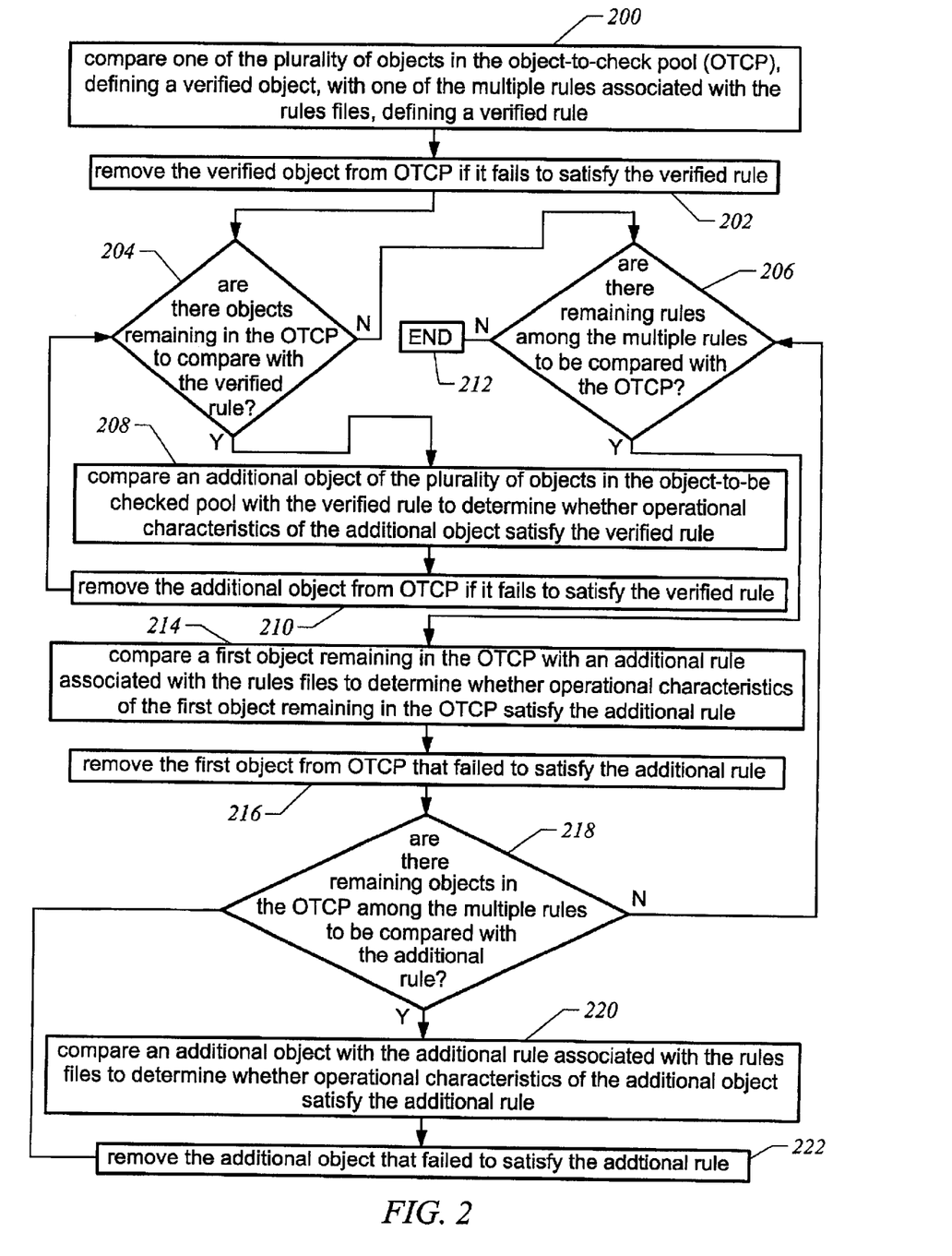
FIG. 2 is a flow diagram showing a method of performing DRCs/ERCs in accordance with a first embodiment of the present invention.

Referring to FIG. 2, in operation, at step 200, one of plurality of objects 170a in the OTCP, defining a verified object, is compared with one of the multiple rules associated with rules files 170b, defining a verified rule. This is achieved to determine whether design characteristics of the verified object satisfy the verified rule. To minimize the number of comparisons that must be made with the verified object, the verified rule is selected from among the multiple rules to maximize a probability of determining whether design characteristics of the verified object fails to satisfy all verified rules associated with rules files. Examples of comparisons at step 200 determine whether an area of a feature is smaller than a predetermined amount, a metal does not overlap a via, or identifying feature geometries having 45 degree edges (design rules typically only allow 90 degree edges, i.e., intersections at right angles).

At step 202, were it ascertained that the verified object failed to satisfy the verified rule, then the verified object would be removed from the OTCP to prevent comparison with other rules among the rules files. Note that some design characteristics are not compared at step 200. These design characteristics may not be detected because the object is phased out of the OTCP before reaching a check that will detect the error. These errors will be detected in a next pass through the checking process, after the identified error that caused the object to be phased out in the previous pass is fixed.

After step 202, the process would continue at step 204 where it is determined whether there remain, in the OTCP, any objects to compare with the verified rule. Were there no remaining objects 170a to compare with the verified rule, then the process would continue at step 206. Otherwise, the process would continue to step 208.

At step 208, an additional object of the plurality of objects in the OTCP is compared with the verified rule, and at step 210 the additional object is removed from the OTCP if it failed to satisfy the verified rule. Otherwise, the additional object would be retained in the OTCP to compare with remaining rules files. After step 210, the process returns to step 204. As mentioned above, step 206 occurs when it is found that there were no objects remaining in the OTCP that were not compared with the verified rule. At step 206, it is determined whether there remain any rules among the multiple rules files to be compared with objects in the OTCP. Were no rules remaining, the process would end, at step 212. Otherwise, the process continues at step 214.

At step 214 the first object remaining in the OTCP is compared with an additional rule associated with the rules files. This is done to determine whether the design characteristics of the first object satisfy the additional rule. As with step 200, the rule compared at step 214 is selected from among the multiple rules that have yet to be compared with objects 170a remaining in the OTCP, to maximize a probability of determining whether design characteristics of the verified objects fail to satisfy all of the remaining rules associated with rules files 170b. Thus, during the first comparison the rule compared with the objects in the OTCP is the one least likely to result in a failure, while the subsequent rules are compared with the objects in the OTCP in increasing probability of a failure being found. At step 216, the first object from OTCP that failed to satisfy the additional rule is removed from the OTCP. At step 218 it is determined whether there remain, in the OTCP, objects to be compared with the additional rule. If there are, the process continues at step 220. If not, the process returns to step 206.

At step 220 an additional object in the OTCP is compared with the additional rule to determine whether the design characteristics of the additional object satisfies the additional rule. Were the additional object found not to satisfy the additional rule, then the additional object would be removed from the OTCP. Otherwise, the additional object would remain in the OTCP. After step 222, the process returns to step 218. The process continues until it is determined whether all the objects in the OTCP satisfy all of the remaining rules associated with the rules files 170b.

A specific example of the present invention is described with respect to DRCs for vias using TI epic7s manufacturing technology. Using this manufacturing technology, vias are only allowed in two different types of geometries, i.e., a square or a rectangle having a predetermined width and length. Thus, in accordance with the present invention the DRC entails comparing the geometries of objects at steps 200 and 208 to see whether the same have satisfied the square or rectangle rules. At steps 202 and 210 objects are removed from the OTCP were it determined that the design characteristics associated therewith contained non-rectangular geometries. As a result, the only vias remaining in the OTCP at step 214 are vias that are a square or vias that are a rectangle having the predetermined width and length. Then, in accordance with the present example, more complex via spacing DRCs are compared at step 214. For example, one via spacing design rule comprises six (6) different spacing design rules that fall into three categories, namely, (a) a design rule regarding square via to square via spacing; (b) design rules regarding square via to rectangular via spacing, i.e., (i) spacing between a square via and a side of a rectangular via, and (ii) spacing between a square via and an end of a rectangular via; and (c) design rules regarding rectangular via to rectangular via spacing, i.e., (i) spacing between a side of a rectangular via and a side of a rectangular via, (ii) spacing between an end of a rectangular via and an end of another rectangular via, and (iii) spacing between an end of a rectangular via and a side of a rectangular via.

It should be noted, that the benefit provided by the aforementioned process could be satisfied by removing from the OTCP, objects that satisfy the rules with which they are checked at steps 202, 210, 216 and 222. As a result, objects are identified as having satisfied the rule with which there is a comparison and are not subjected to further comparisons. An example of this alternate embodiment could include utilizing a "gross spacing" DRC, before applying all of the above-described complex via spacing DRCs at step 200. The "gross spacing" DRC combines two DRCs (a) a scan_radius DRC and (b) a dead zone DRC using a length equal to scan_radius. Most verification software provides: (a) a scan_radius DRC which involves investigating an area traced out by a radius of a circle, the radius being equal to scan_radius, for vias, and (b) a dead zone DRC which involves investigating a square area having an input value equal to a length of the side of the square for vias. To perform the scan_radius DRC and the dead zone DRC, a scan_radius variable is defined in terms of two entities: (a) ViaSqToViaRs (the manufacturing design rule minimum distance between a square via and a side of a rectangular via) and (b) ViaReToViaRe (the manufacturing design rule minimum distance between an end of a rectangular via and an end of a rectangular via). Using these two entities, scan_radius is defined as:

$$\text{sqrt}(ViaSqToViaRs * ViaSqToViaRs + ViaReToViaRe * ViaReToViaRe)$$

A via that satisfies this scan_radius DRC and this dead zone DRC is phased out of the OTCP because such a via is separated far enough from other vias that there is no need to perform any of the complex spacing DRCs identified above. As a result, the "gross spacing" DRC can be used to save time that would otherwise have been spent on the more complex spacing DRCs.

Then at step 214, a rectangular side to side spacing DRC is applied together with a square to rectangular side DRC. Although this step is more complex than a simple separation DRC, since there are fewer objects in the OTCP, overall performance of the DRC process improves. Lastly, as a final rule, the most complex rectangular end to end DRC, and the different dimension dead zone DRC is performed on all objects remaining in the OTCP. Since the OTCP is now at its smallest size, and all vias with side spacing violations have been phased out of the OTCP, this step focuses only on via end to end violations.

Figure 3A:
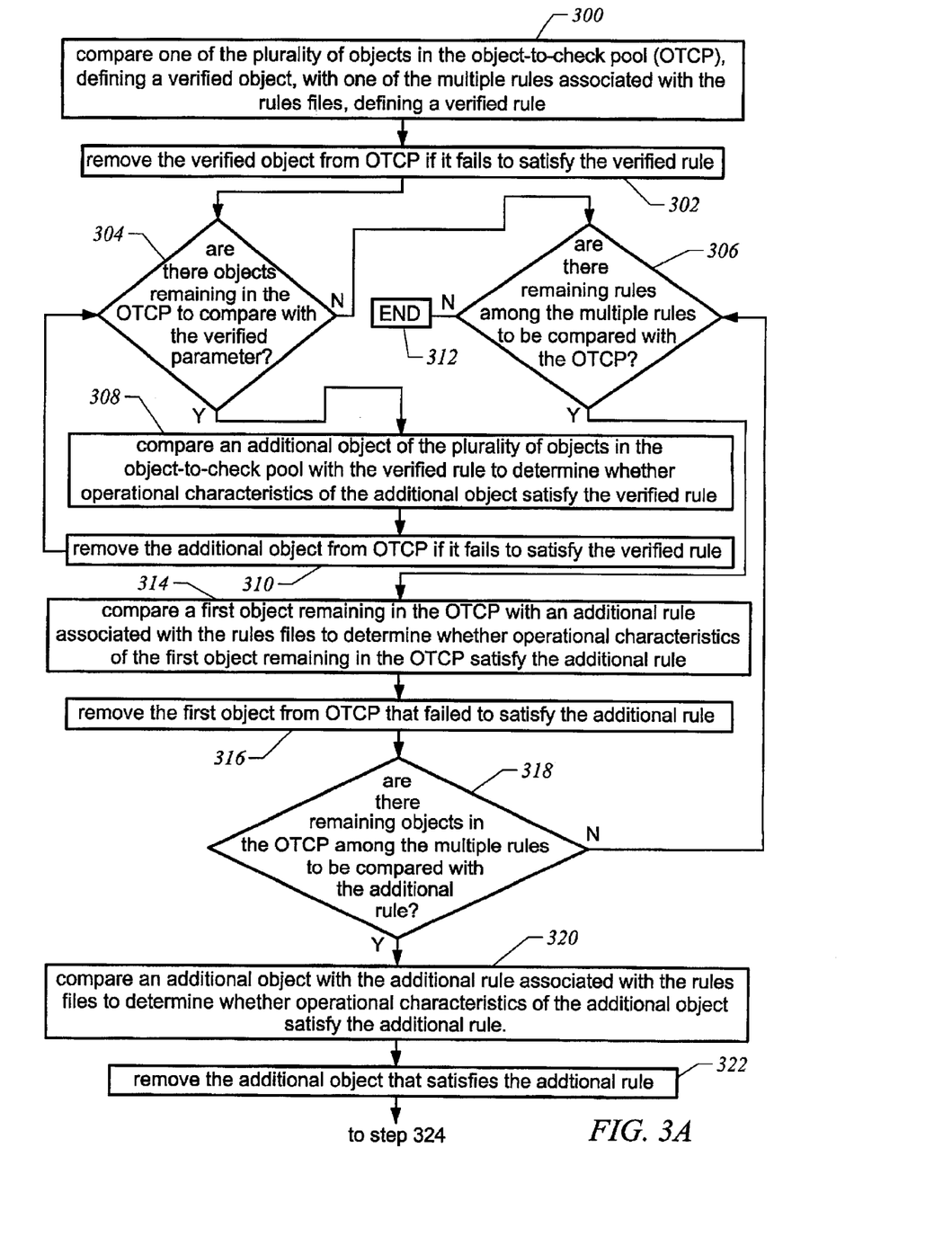
FIGS. 3A and 3B show a flow diagram demonstrating a method of performing DRCs/ERCs in accordance with a second embodiment of the present invention.
Figure 3B:
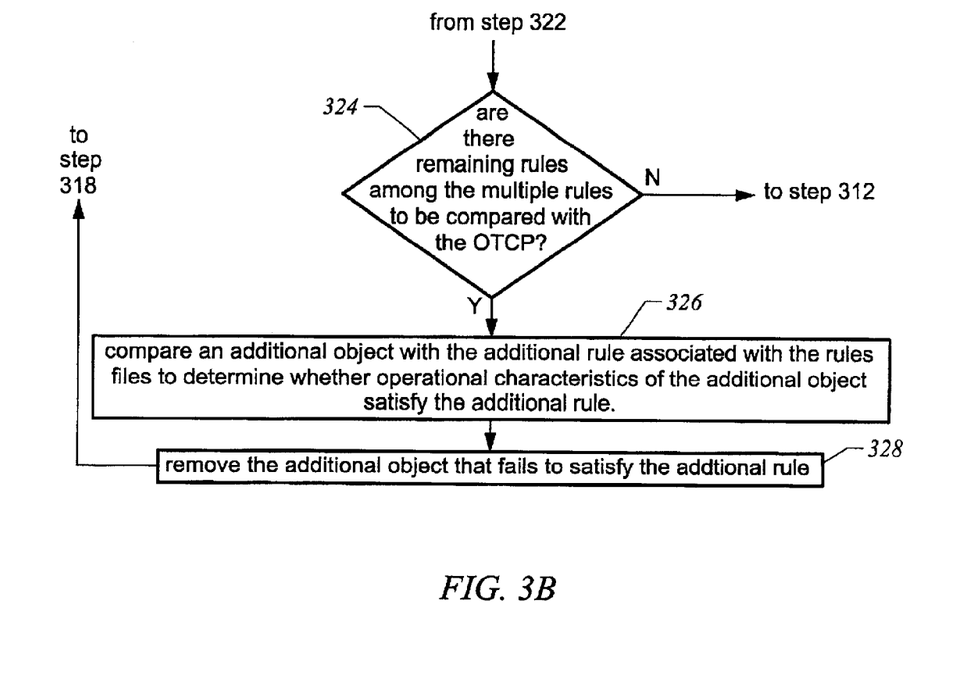

Referring to FIGS. 3A and 3B, in accordance with an alternate embodiment of the present invention, the process includes removing objects from the OTCP that satisfy the rules, as well as objects that fail to satisfy the rules. To that end, the process includes steps 300, 302, 304, 306, 308, 310, 312, 314, 316, 318, 320, 322, 324, 326 and 328. Steps 300, 302, 304, 306, 308, 310, 312, 314, 316, 318 and 320 correspond, and are identical to, steps 200, 202, 204, 206, 208, 210, 212, 214, 216, 218, 220 and 222, shown in FIG. 2.

Referring to FIGS. 2, 3A and 3B, step 322 differs from step 222, in that step 322 removes from the OTCP, objects having design characteristics that satisfy the additional rule. In addition, after step 322, instead of returning to step 318, the process continues to step 324. At step 324 it is determined whether there are rules remaining among the multiple rules that need to be compared with objects in the OTCP. Were there not, the process would then proceed to step 312. Otherwise, the process would continue to proceed to step 326 to compare an additional object with the additional rule associated with the rules files to determine whether design characteristics of the additional object satisfy the additional rule. Thereafter, were it determined that the additional object failed to satisfy the additional rule, the object would be removed from the OTCP. It should be noted that steps 302, 310, 316 and 328 may remove objects whose design characteristics satisfied the rules with which a comparison is made, and step 322 would remove objects from the OTCP whose design characteristics failed to satisfy the rules with which they are compared.

Those skilled in the art will recognize that the foregoing description has been presented for the sake of illustration and description only. As such, it is not intended to be exhaustive or to limit the invention to the precise form disclosed. For example, it is understood that different combinations of hardware may be used in constructing any of the computer based systems described herein, and that any of the computer based systems may comprise multiple computer platforms with separate CPU's or a single computer platform executing a software program as described herein. Additionally, a computing apparatus may be specially constructed for the required purposes, instead of the general purpose computer selectively activated or configured by a computer program stored in the computer discussed above.

What is claimed is:

1. A method for checking integrated circuit design files using rules files, with each of said rules files having a rule associated therewith, said method comprising:
    arranging said rules in a sequence to maximize a probability of determining whether design characteristics of objects associated with said design files in an object-to-check pool (OTCP) satisfy all rules associated with said rules files while minimizing a number of rules that must be compared with said objects; and
    comparing said rules with said objects according to the sequence in which said rules are arranged.

2. The method as recited in claim 1 wherein each of said rules has a failure probability associated therewith indicating a level of possibility that said object in said OTCP would fail to satisfy said rules, with each of said rules being assigned a position in said sequence, so that said objects in said OTCP are compared with rules having a lowest failure probability before comparison with the remaining rules of said sequence.

3. The method as recited in claim 1 wherein each of said rules has a success probability associated therewith indicating a level of possibility that said objects in said OTCP would satisfy said rules, with each of said rules being assigned a position in said sequence, so that said design files are compared with rules having a highest success probability before comparison with the remaining rules of said sequence.

4. The method as recited in claim 1 wherein each of said rules has a complexity associated therewith, with each of said rules being assigned a position in said sequence so that said objects in said OTCP are compared with rules having a lowest complexity before comparison with the remaining rules of said sequence.

5. The method as recited in claims 1 wherein comparing further includes comparing each of said objects in said OTCP with one of said rules of said sequence before comparing said OTCP with an additional rule in said sequence and further including phasing, from said OTCP, objects files for which it has been ascertained whether said objects satisfy said rules, defining phased objects, thereby omitting comparisons between said phased objects and said additional rule.

6. The method as recited in claim 1 wherein said rules are parameters selected from a set of parameters consisting of design rule parameters and electrical rule parameters.

7. The method as recited in claim 6 wherein said design rule parameters include object area, object geometry and object orientation and said electrical rule parameters include object power, object resistance, object current and object voltage.

8. A method for checking integrated circuit design files using rules files, with each of said rules files having a rule associated therewith, said method comprising:

sequentially comparing said rules with objects associated with said design files in an object-to-check-pool (OTCP) to maximize a probability of determining whether said design characteristics of said objects in said OTCP satisfy all rules associated with said rules files while minimizing a number of rules that must be compared with the OTCP by comparing each of said objects in said OTCP with one of said rules of said sequence before comparing said OTCP with an additional rule in said sequence and phasing, from said OTCP, objects for which it has been ascertained whether said objects satisfy said rules, defining phased objects, thereby omitting comparisons between said phased objects and said additional rule.

9. The method as recited in claim 8 wherein sequentially comparing further includes arranging said rules in a sequence and comparing said objects in said OTCP with said sequence, with each of said rules meters having a failure probability associated therewith indicating a level of possibility that said object in said OTCP would fail to satisfy said rules, with each of said rules being assigned a position in said sequence, so that said objects in said OTCP are compared with rules having a lowest failure probability before comparison with the remaining rules of said sequence.

10. The method as recited in claim 9 wherein sequentially comparing further includes arranging said rules in a sequence and comparing said objects in said OTCP with said sequence, with each of said rules having a success probability associated therewith indicating a level of possibility that said objects in said OTCP would satisfy said rules, with each of said rules being assigned a position in said sequence, so that said design files of said group are compared with rules having a lowest success probability before comparison with the remaining rules of said sequence.

11. The method as recited in claim 10 wherein sequentially comparing further includes arranging said rules in a sequence and comparing said objects in said OTCP with said sequence, with each of said rules having a complexity associated therewith, with each of said rules being assigned a position in said sequence so that said objects in said OTCP are compared with rules having a highest complexity before comparison with the remaining rules of said sequence.

12. A computer-readable program contained in a computer-readable medium and including information concerning rules files, with each of said rules files having a rule associated therewith, to check integrated circuit design files, said computer readable program comprising:

code to arrange said rules in a sequence to maximize a probability of determining whether design characteristics of objects associated with said design files in an object-to-check pool (OTCP) satisfy all rules associated with said rules files while minimizing a number of rules that must be compared with said objects; and code to compare said rules with said objects according to the sequence in which said rules are arranged.

13. The computer-readable program as recited in claim 12 wherein each of said rules has a failure probability associated therewith indicating a level of possibility that said object in said OTCP would fail to satisfy said rules, with each of said rules being assigned a position in said sequence, so that said objects in said OTCP are compared with rules having a lowest failure probability before comparison with the remaining rules of said sequence.

14. The computer-readable program as recited in claim 12 wherein each of said rules has a success probability associated therewith indicating a level of possibility that said objects in said OTCP would satisfy said rules, with each of said rules being assigned a position in said sequence, so that said design files of said group are compared with rules having a highest success probability before comparison with the remaining rules of said sequence.

15. The computer-readable program as recited in claim 12 wherein each of said rules has a complexity associated therewith, with each of said rules being assigned a position in said sequence so that said objects in said OTCP are compared with rules having a lowest complexity before comparison with the remaining rules of said sequence.

16. The computer-readable program as recited in claim 12 wherein said code to compare further includes a subroutine to compare each of said objects in said OTCP with one of said rules of said sequence before comparing said OTCP with an additional rule in said sequence and further including phasing, from said OTCP, object files for which it has been ascertained whether said objects satisfy said rules, defining phased objects, thereby omitting comparisons between said phased objects and said additional rule.

17. The method as recited in claim 12 wherein said rules are parameters selected from a set of parameters consisting of design rule parameters and electrical rule parameters, wherein said design rule parameters include object area, object geometry and object orientation and said electrical rule parameters include object power, object resistance, object current and object voltage.

18. An apparatus for checking integrated circuit design files using rules files, with each of said rules files having a rule associated therewith, said apparatus comprising:

means for sequentially comparing said rules with objects associated with said design files in an object-to-check-pool (OTCP) to maximize a probability of determining whether said design characteristics of said objects in said OTCP satisfy all rules associated with said rules files and minimize a number of rules that must be compared with the OTCP by comparing each of said objects in said OTCP with one of said rules of said sequence before comparing said OTCP with an additional rule in said sequence; and means for phasing, from said OTCP, objects for which it has been ascertained whether said objects satisfy said rules, defining phased objects, thereby omitting comparisons between said phased objects and said additional rule.

19. The apparatus as recited in claim 18 wherein each of said rules having a failure probability associated therewith indicating a level of possibility that said object in said OTCP would fail to satisfy said rules, and said means for sequentially comparing further includes means for arranging said rules in a sequence and comparing said objects in said OTCP with said sequence, with each of said rules being assigned a position in said sequence so that said objects in said OTCP are compared with rules having a lowest failure probability before comparison with the remaining rules of said sequence.

20. The apparatus recited in claim 18 wherein each of said rules having a failure probability associated therewith indicating a level of possibility that said object in said OTCP would fail to satisfy said rules, and said means for sequentially comparing further includes means for arranging said rules in a sequence and comparing said objects in said OTCP with said sequence, with each of said rules being assigned a position in said sequence so that said design files of said group are compared with rules having a highest success probability before comparison with the remaining rules of said sequence.

* * * * *